United States Patent [19]
Hamamoto et al.

[11] Patent Number: 5,397,713
[45] Date of Patent: Mar. 14, 1995

[54] METHOD OF PRODUCING THIN-FILM SOLAR CELL

[75] Inventors: Satoshi Hamamoto; Mikio DeGuchi, both of Itami, Japan

[73] Assignee: Mitsubishi Denki Kabushiki Kaisha, Tokyo, Japan

[21] Appl. No.: 993,021

[22] Filed: Dec. 18, 1992

[30] Foreign Application Priority Data

Jun. 19, 1992 [JP] Japan ................................. 4-186083

[51] Int. Cl.6 .......................................... H01L 31/18
[52] U.S. Cl. ..................................... 437/4; 136/258;
148/DIG. 135; 437/2; 437/233; 437/234;
437/966; 437/967; 437/974
[58] Field of Search ................................ 437/2–5,
437/86, 233–234, 966–967, 974; 148/DIG. 135;
136/258 PC, 260; 264/81

[56] References Cited

U.S. PATENT DOCUMENTS

| | | | |
|---|---|---|---|
| 4,131,659 | 12/1978 | Authier et al. | 264/25 |
| 4,238,436 | 12/1980 | Hill et al. | 264/81 |
| 4,370,288 | 1/1983 | Rice, Jr. et al. | 264/81 |
| 4,445,965 | 5/1984 | Milnes | 156/624 |

FOREIGN PATENT DOCUMENTS 3902452  1/1989  Germany ........................ 136/256

OTHER PUBLICATIONS

Filonov et al, "Development of the Two-Shaping-Elements (TSE) Method for Silicon Sheet Growth", *Journal of Crystal Growth* vol. 104 (1990) pp. 98–101.

Kirkpatrick et al, "A Nonconventional Approach to Thin Film Cell Fabrication", IEEE 1978, pp. 1342–1346.

T. L. Chu, "Silicon Films on Foreign Substrates for Solar Cells" *Journal of Crystal Growth* vol. 39, (1977) pp. 45–60.

*Primary Examiner*—Aaron Weisstuch
*Attorney, Agent, or Firm*—Leydig, Voit & Mayer

[57] ABSTRACT

In a method of producing a thin-film solar cell, a graphite sheet in which the breaking stress in a thickness direction is smaller than the breaking stress in a direction perpendicular to the thickness direction is adhered to a heat resistant substrate, a semiconductor thin film is formed on the graphite sheet in a high temperature process, a second substrate for supporting the semiconductor thin film is adhered to the semiconductor thin film, and the graphite sheet is broken by applying a mechanical stress to the heat resistant substrate and the second substrate. The semiconductor thin film is reliably supported by the heat resistant substrate during high temperature processing and easily removed from the heat resistant substrate by breaking the graphite sheet. In addition, since the graphite sheet has an anisotropic breaking stress, fragments of the graphite sheet remaining on the surface of the semiconductor thin film are easily removed. As a result, a high quality thin film solar cell is produced reliably at low cost.

2 Claims, 11 Drawing Sheets

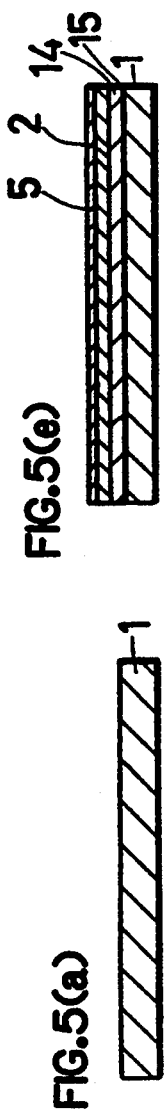
FIG.5(a)
FIG.5(b)
FIG.5(c)
FIG.5(d)
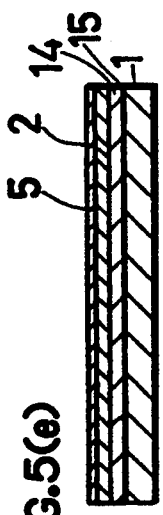
FIG.5(e)
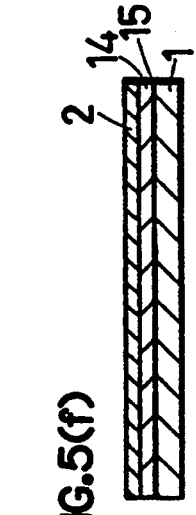
FIG.5(f)
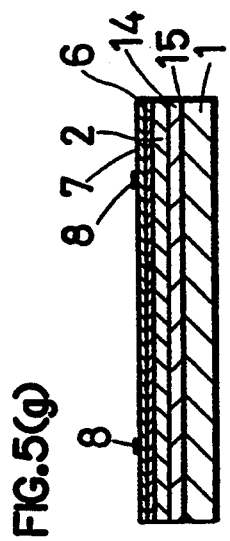
FIG.5(g)
FIG.5(i)
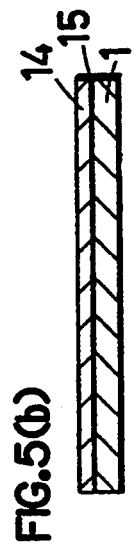
FIG.5(j)
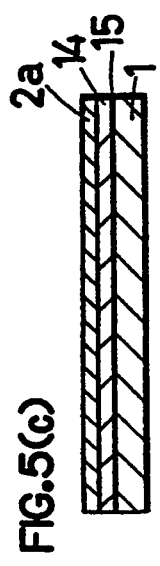
FIG.5(k)
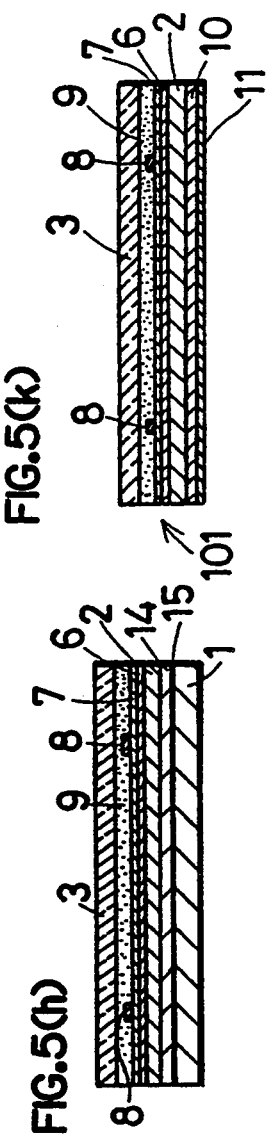
FIG.5(h)

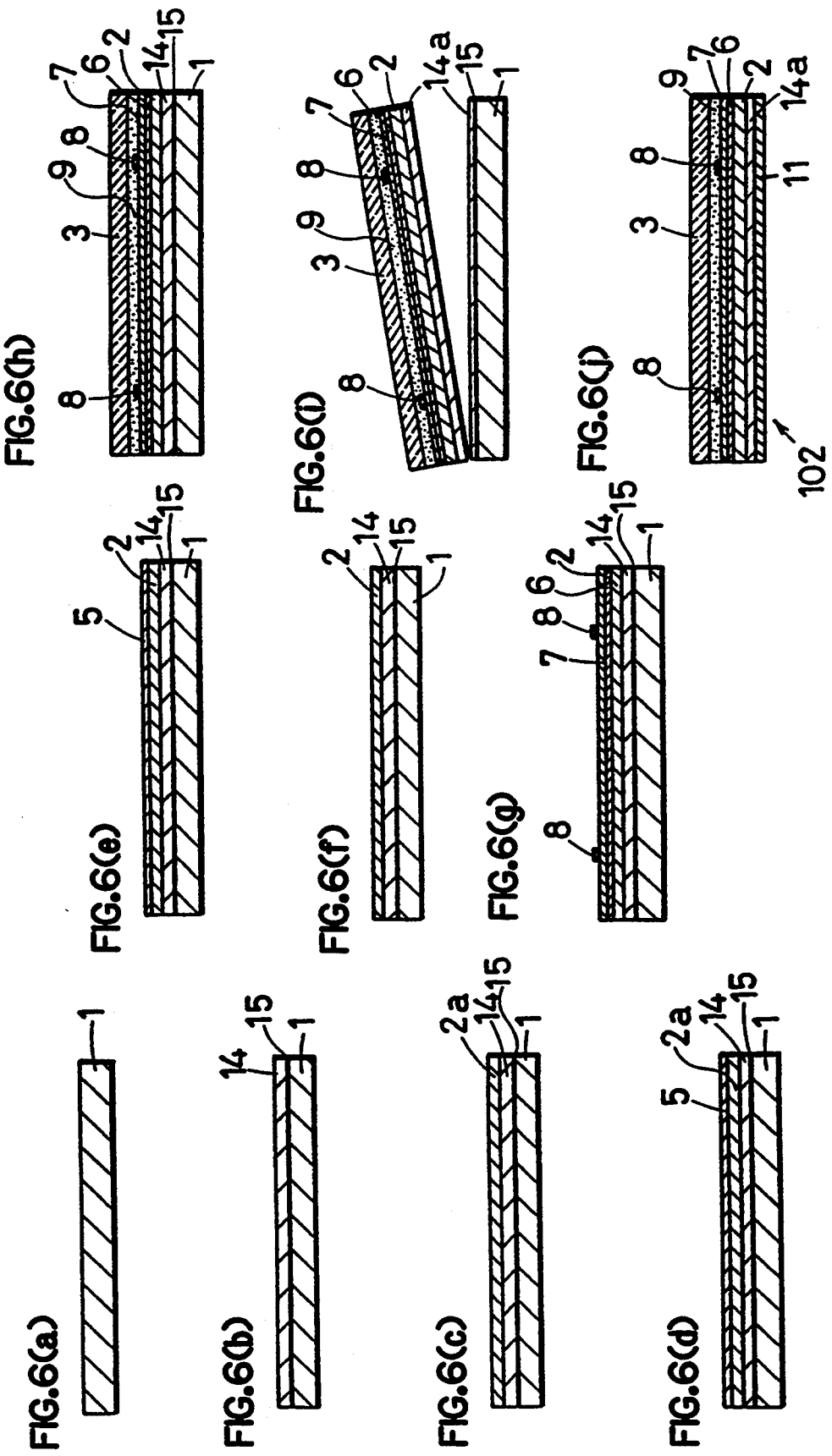

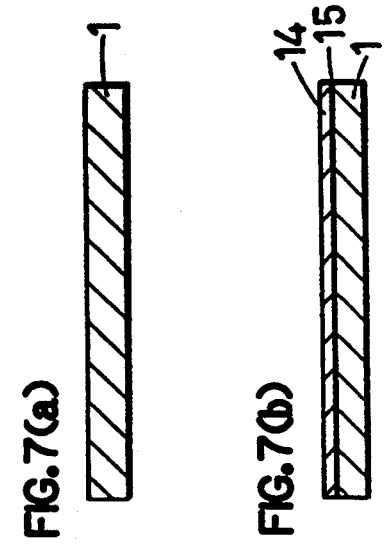
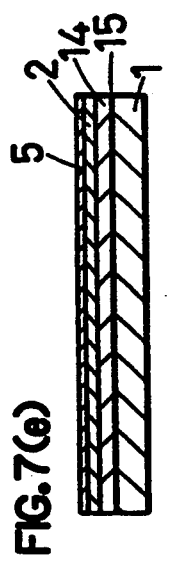
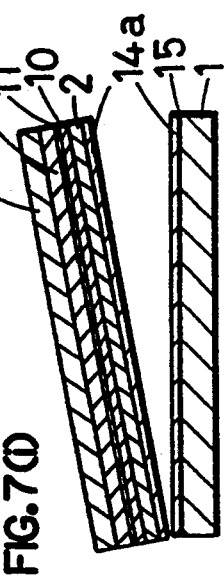
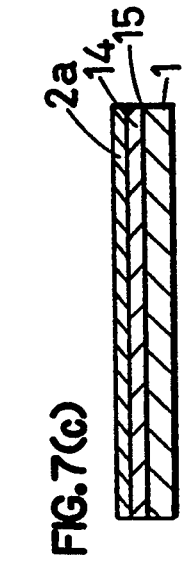
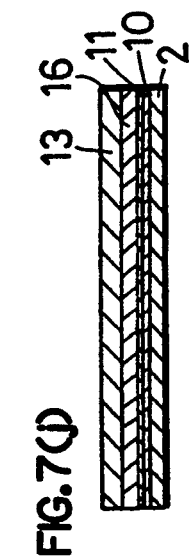
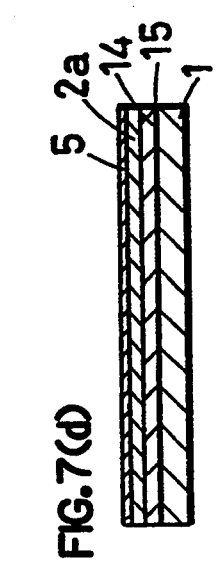
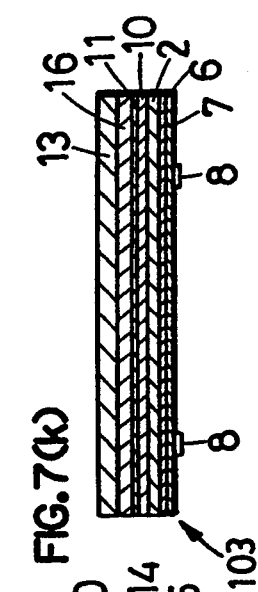
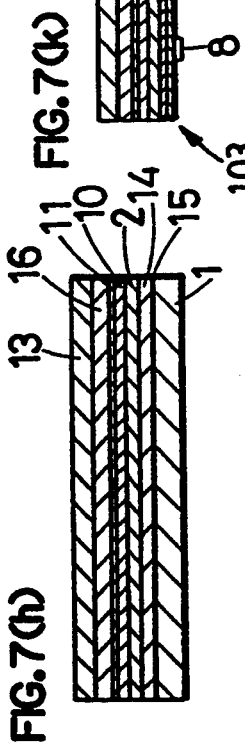

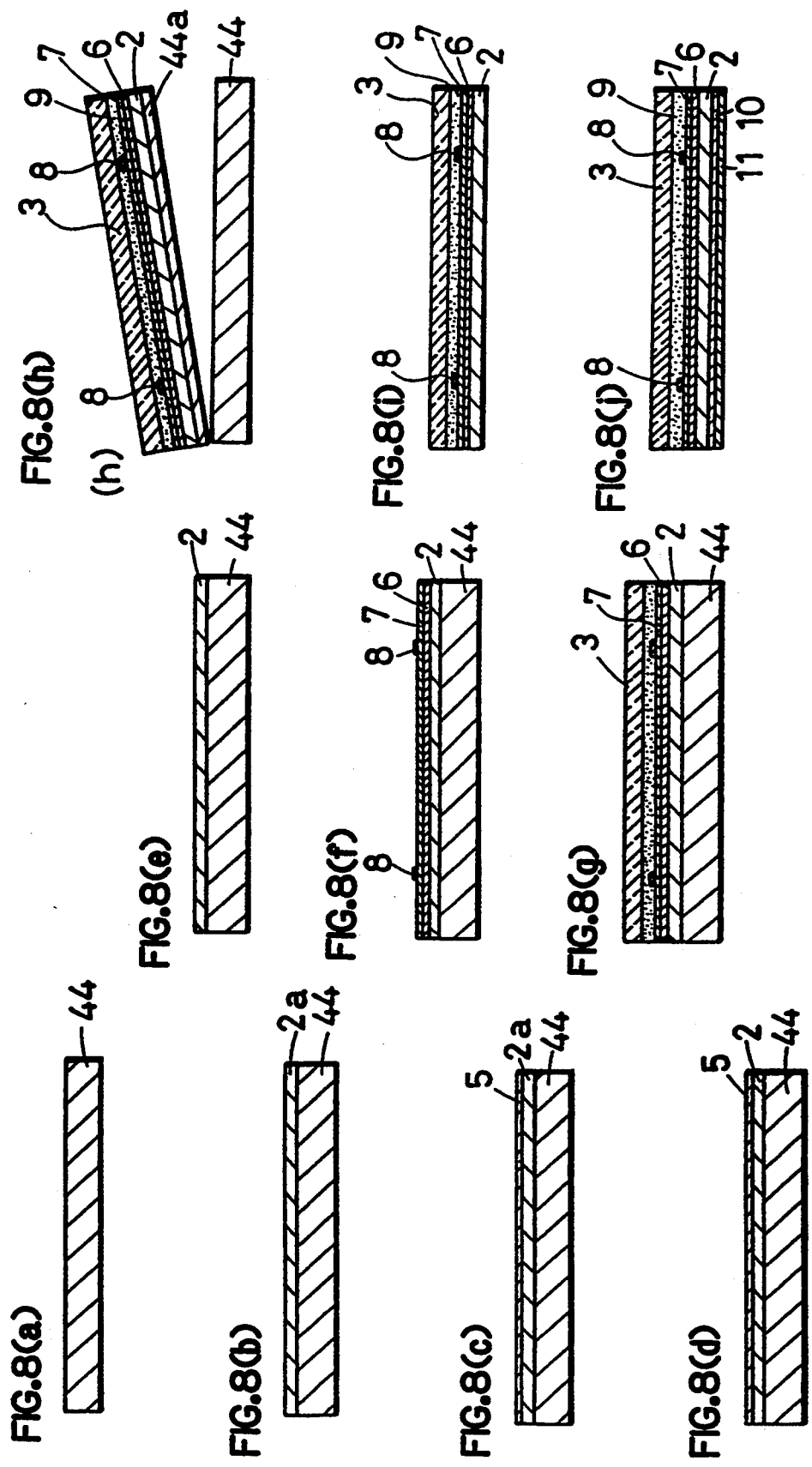

METHOD OF PRODUCING THIN-FILM SOLAR CELL

FIELD OF THE INVENTION

The present invention relates to a method of producing a thin-film solar cell and, more particularly, including a step of removing a semiconductor thin film which contributes to power generation from a heat resistant substrate and adhering the semiconductor thin film to a substrate comprising glass or the like.

BACKGROUND OF THE INVENTION

In solar cells, a greater part of the photocarriers are generated in a surface region of an active layer and, therefore, thin-film solar cells, in which an active layer contributing to power generation is a thin film to reduce the cost of materials and production time of the active layer, have been developed.

FIG. 9 is a perspective view illustrating a structure of a prior art thin-film solar cell. In FIG. 9, reference numeral 100 designates a thin-film solar cell which generates electric power by converting incident light to electricity. In the solar cell 100, an active layer 20 several tens of microns thick including a p-n junction and contributing to power generation is disposed on a conductive substrate 50. An anti-reflection film 30 is disposed on the active layer 20 and prevents the incident light from being reflected at the surface of the active layer. An upper electrode 40 is disposed on the anti-reflection film 30 and a lower electrode 60 is disposed on the rear surface of the conductive substrate 50. The upper electrode 40 comprises a grid electrode 40a for collecting photoelectric current generated in the active layer 20 and a bus electrode 40b for concentrating the photoelectric current from the grid electrode 40a.

In this thin-film solar cell 100, since the active layer 20 contributing to power generation is as thin as several tens of microns, it cannot mechanically support itself, so that a substrate or the like for supporting the thin active layer 20 is needed. The following conditions are required of the substrate.

First, the substrate should be strong enough to automatically support the thin film and itself. Second, since the Si thin film active layer is grown on the substrate by thermal CVD or the like, the substrate should be refractory so that it can stand a process temperature of approximately 1000 C. during the thermal CVD. Third, since the substrate also serves as a lower electrode, it should be conductive. Even if the substrate is not conductive, a thin-film solar cell can be achieved. In this case, however, it is necessary to dispose a conductive film on the substrate or draw out the lower electrode from the side surface of the solar cell, resulting in a complicated structure. Fourth, since the substrate itself does not contribute to power generation but only supports the active layer, it is desirable that the substrate be formed by an inexpensive method using an inexpensive material.

However, a material for such a substrate with sufficient mechanical strength and heat resisting property is expensive. Furthermore, when the substrate should also be conductive, it is very difficult to select a material for the substrate.

Therefore, in a prior art method of producing a thin-film solar cell, after a semiconductor thin film is formed on a heat resistant substrate at a high temperature, the semiconductor thin film is removed from the heat resistant substrate and adhered to a cheap substrate. The heat resistant substrate is repeatedly used. Since actual process steps in this prior art method are complicated, a basic concept thereof will be described first with reference to FIGS. 10(a)–10(d).

As illustrated in FIG. 10(a), a layer 4 comprising sintered silicon nitride powder is formed on the surface of the heat resistant substrate 1. Then, as illustrated in FIG. 10(b), a semiconductor thin film 2 is grown on the layer 4 by thermal CVD or the like. Thereafter, the semiconductor thin film 2 is subjected to process steps, such as annealing, recrystallization, or formation of a p-n junction, as occasion requires. After the processing, a glass substrate 3 is adhered to the semiconductor thin film 2 as illustrated in FIG. 10(c).

Thereafter, the layer 4 is broken to separate the semiconductor thin film 2 from the heat resistant substrate 1 as illustrated in FIG. 10(d). Since the layer 4 comprises sintered silicon nitride powder, there is a weak bonding strength between particles. Therefore, when mechanical stress is applied to the heat resistant substrate 1 and the glass substrate 3 to separate them from each other, only the layer 4 is broken.

In this way, the semiconductor thin film 2 is removed from the heat resistant substrate 1 and adhered to the glass substrate 3, and the subsequent processing is carried out with the semiconductor thin film 2 disposed on the glass substrate 3.

The above-described method of producing a thin-film solar cell will be described in more detail according to actual process steps.

FIGS. 11(a)–11(k) are cross-sectional views illustrating process steps in a prior art method of producing a thin-film solar cell. In the figures, a layer 4 is disposed on a heat resistant substrate 1 comprising silicon. The layer 4 is formed by applying a paste, comprising silicon nitride powder, to the substrate and sintering the paste. A semiconductor thin film 2a is disposed on the silicon nitride layer 4. The semiconductor thin film 2a is formed by growing p type polycrystalline silicon on the silicon nitride layer 4 by vapor phase deposition. The polycrystalline Si thin film 2a is covered with a cap layer 5. When the thin film 2a is melted and recrystallized, the cap layer 5 prevents the melted portion of the thin film 2a from condensing and separating into islands.

Reference numeral 2 designates a p type semiconductor thin film in which the diameters of crystal grains are increased by melting and recrystallizing the polycrystalline Si thin film 2a. An n+ type region 6 is formed at the surface of the thin film 2 by diffusing a dopant like phosphorus, arsenic, or antimony into the p type semiconductor thin film 2, and a p-n junction is produced at the boundary between the n+ type region 6 and the p type semiconductor thin film 2. The thickness of the n+ type diffused region 6 is appropriately selected within a range of 100 angstroms to 1 micron. In place of the n+ type diffused region 6, an n type microcrystalline film may be used, which is obtained by depositing silicon including an impurity like phosphorus on the semiconductor thin film 2. A conductive anti-reflection film 7 is disposed on the n+ type diffused region 6. The anti-reflection film 7 reduces reflection of incident light from the semiconductor thin film 2. A grid electrode 8 for collecting photoelectric current generated in the semiconductor thin film 2 is disposed on the anti-reflection film 7.

A cover glass 3 is adhered to the surface of the semiconductor thin film 2 via a resin 9 like EVA (Ethylene Vinyl Acetate). This cover glass 3 serves as a substrate for supporting the semiconductor thin film 2 after the semiconductor thin film 2 is separated from the heat resistant substrate 1. A rear electrode 11 comprising Ag is disposed on the rear surface of the semiconductor thin film 2 and a p+ type BSF (Back Surface Field) layer 10 is disposed between the semiconductor thin film 2 and the rear electrode 11. The p+ type BSF layer 10 forms an energy barrier in the semiconductor thin film 2 in the vicinity of the rear electrode 11 and prevents photocarriers from reaching the boundary between the semiconductor thin film 2 and the rear electrode 11, whereby annihilation of photocarriers in the vicinity of the boundary is avoided.

A description is now given of the production method.

First of all, the heat resistant substrate 1 shown in FIG. 11(a) is prepared. Then, a paste comprising silicon nitride powder is applied to the heat resistant substrate 1 and sintered to form the layer 4 about 100 microns thick (FIG. 11(b)). Then, p type polycrystalline silicon is grown on the layer 4 by vapor phase deposition to form the p type polycrystalline Si thin film 2a about 30 microns thick (FIG. 11(c)). Thereafter, SiO$_2$ is deposited on the polycrystalline Si thin film 2a to form the cap layer 5 (FIG. 11(d)). Then, zone melting and recrystallization of the polycrystalline Si thin film 2a is carried out. More specifically, a portion of the polycrystalline Si thin film 2a is melted by laser radiation or the like and this portion is moved through the polycrystalline Si thin film 2a to recrystallize the thin film 2a (FIG. 11(e)). Thereafter, the cap layer 5 is removed (FIG. 11(f)).

Then, an n type dopant like phosphorus is diffused into the surface region of the semiconductor thin film 2 to form an n+ type diffused region about several thousands of angstroms thick, whereby a p-n junction is produced in the semiconductor thin film 2. Then, an anti-reflection film 7 about several hundreds of angstroms thick is formed on the n+ type diffused region 6. Then, a grid electrode 8 comprising a lower Ti layer and an upper Ag layer is formed on the anti-reflection film 7, completing the process steps with respect to the upper side of the thin-film solar cell (FIG. 11(g)). In addition, the anti-reflection film 7 is a transparent electrode comprising ITO (Indium Tin Oxide).

Thereafter, a glass substrate 3 is adhered to the surface of the thin-film solar cell via the resin 9, such as EVA (FIG. 11(g)). This glass substrate 3 serves as a cover glass when a solar cell module is produced. This glass substrate 3 may be directly adhered to the surface of the solar cell by welding. Then, a mechanical stress is applied to the heat resistant substrate 1 and the glass substrate 3 to separate them from each other, so that the layer 4 is broken and the the semiconductor thin film 2 is separated from the heat resistant substrate 1 (FIG. 11(i)).

This separation process will be described in more detail with reference to FIGS. 12(a) and 12(b). Initially, as illustrated in FIG. 12(a), the wafer shown in FIG. 11(h) is put on a stage 70 so that an end of the wafer abuts a projection 71. Then, a wedge 72 is inserted into the silicon nitride layer 4 exposed on the side surface of the wafer to crack the layer 4. Then, as illustrated in FIG. 12(b), the glass substrate 3 is picked up with tweezers 74 while the wafer is fixed by pressing the heat resistant substrate 1 against the projection 71 using a push rod 73, whereby the semiconductor thin film 2 is separated from the heat resistant substrate 1.

Then, fragments 4a of the layer 4 remaining on the surface of the semiconductor thin film 2 are etched away using heated phosphoric acid. Then, a paste including a p type impurity like aluminum is applied to the surface of the thin film 2 and then it is sintered to diffuse the p type impurity into the thin film 2, whereby a p+ type BSF layer 10 about several microns thick is formed. Then, the sintered paste is removed, or it may be left on the BSF layer 10. Then, the rear electrode 11 comprising Ag is formed on the surface of the p+ type BSF layer 10, completing process steps with respect to the rear side of the solar cell (FIG. 11(k)).

In this way, the thin-film solar cell 120 is produced.

In the conventional production method, however, since the layer 4 comprises silicon nitride which is an insulating material, after the semiconductor thin film 2 is separated from the heat resistant substrate 1, it is necessary to remove the fragments 4a of the layer 4 remaining on the surface of the semiconductor thin film 2. In addition, since the layer 4 is obtained by sintering a paste comprising silicon nitride powder, the composition thereof is not uniform. That is, silicon nitride acts upon other materials to produce other compounds in some portions of the layer 4 while silicon nitride remains in the other portions. In this case, it is difficult to completely remove the fragments 4a remaining on the semiconductor thin film 2 by etching using heated phosphoric acid which is usually used for removing silicon nitride.

In addition, the layer 4 should satisfy conflicting requirements, i.e., it should have a mechanical strength strong enough to withstand the stress applied thereto during the formation of the semiconductor thin film 2 and, at the same time, it should be easily broken when the semiconductor thin film 2 is separated from the heat resistant substrate 1. However, the breaking stress of a material does not vary according to the direction of the stress applied. More specifically, if a breaking stress in a certain direction is large, a breaking stress in another direction is large. This holds good for the layer 4 comprising sintered silicon nitride powder, too. That is, it is very difficult for the layer 4 to decrease in strength against a stress in a direction along which the layer 4 is broken while keeping sufficient mechanical strength. Therefore, adhesion between the semiconductor thin film and the heat resistant substrate and the simplicity of separating the semiconductor thin film from the heat resistant substrate are trade-offs.

Accordingly, it is difficult to realize a favorable formation of the semiconductor thin film on the heat resistant substrate 1 and an easy separation between the semiconductor thin film and the heat resistant substrate. As a result, it has been impossible to produce a high-quality thin film solar cell with high reliability at low cost.

SUMMARY OF THE INVENTION

It is an object of the present invention to provide a method of producing a thin-film solar cell including steps of favorably producing a semiconductor thin film on a heat resistant substrate that supports the semiconductor thin film with sufficient mechanical strength, easily separating the semiconductor thin film from the heat resistant substrate, and easily removing fragments of a layer remaining on the surface of the semiconductor thin film, thereby producing a high-quality thin film solar cell at low cost with high reliability.

It is another object of the present invention to provide a method of producing a thin-film solar cell omitting the step of removing the fragments remaining on the surface of the semiconductor thin film while maintaining the mechanical strength of the semiconductor thin film on the heat resistant substrate and improving the efficiency in the step of separating the semiconductor thin film from the heat resistant substrate.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a method of producing a thin-film solar cell, a layer in which the breaking stress in a thickness direction is smaller than the breaking stress in a direction perpendicular to the thickness direction is formed on a heat resistant substrate, a semiconductor thin film which converts incident light to electricity and generates photoelectromotive force is formed on the heat resistant substrate via the layer having the anisotropic breaking stress in a high temperature process, a second substrate for supporting the semiconductor thin film is adhered to the surface of the semiconductor thin film, and the layer having the anisotropic breaking stress is broken by applying a mechanical stress to the heat resistant substrate and the second substrate so that the breaking stress in the thickness direction may act on the layer, whereby the semiconductor thin film is separated from the heat resistant substrate. Therefore, in the high temperature process for producing the semiconductor thin film, the semiconductor thin film is reliably supported by the heat resistant substrate, and in the step of separating the semiconductor thin film from the heat resistant substrate, the separation is easily carried out by breaking the layer. In addition, since the layer to be broken has the anisotropic breaking stress, fragments of the broken layer remaining on the surface of the semiconductor thin film are easily removed. In this way, the semiconductor thin film is favorably formed on the heat resistant substrate and easily removed from the heat resistant substrate, with a result that a high-quality thin film solar cell is produced with high reliability at low cost.

According to a second aspect of the present invention, in the above-described method of producing a thin-film solar cell, after the semiconductor thin film is separated from the heat resistant substrate, fragments of the broken layer remaining on the surface of the semiconductor thin film are removed by brushing. Therefore, there is no necessity of providing a special apparatus for the removal of the fragments, so that this method has an advantage with respect to the equipment used in production and in the management therefor.

According to a third aspect of the present invention, in a method of producing a thin-film solar cell, after the semiconductor thin film is separated from the heat resistant substrate, fragments of the broken layer remaining on the surface of the semiconductor thin film are removed by chemical etching. Therefore, the fragments are completely removed.

According to a fourth aspect of the present invention, in a method of producing a thin-film solar cell, a sheet comprising flaky graphite in which a crystal structure or a layer structure in the thickness direction is different from that in a direction perpendicular to the thickness direction is used as the layer to be broken. Since the graphite sheet is electrically conductive, it is not necessary to remove the fragments of the graphite sheet remaining on the surface of the semiconductor thin film, whereby the production process is simplified.

According to a fifth aspect of the present invention, in a method of producing a thin-film solar cell, the thickness of the graphite sheet is increased so that it may have a mechanical strength sufficient to support itself and the semiconductor thin film during high temperature processing, whereby the graphite sheet also serves as the heat resistant substrate. Therefore, the heat resistant substrate, which is a part used in the production process, can be dispensed with, whereby the burden of management of the parts and the cost of the parts are reduced.

According to a sixth aspect of the present invention, in a method of producing a thin-film solar cell, a transparent plate is used as the second substrate for supporting the semiconductor thin film, and the surface of the semiconductor thin film where the second substrate is present receives incident light. Therefore, the light receiving surface is not damaged by brushing or etching for removing fragments of the broken layer, so that absorption of incident light and generation of photocarriers are effectively carried out, resulting in a high-quality thin film solar cell.

According to a seventh aspect of the present invention, in a method of producing a thin-film solar cell, a stainless steel plate is used as the second substrate for supporting the semiconductor thin film, and the surface of the semiconductor thin film where the stainless steel plate is absent receives incident light. Therefore, thermal treatment is possible after the semiconductor thin film is separated from the heat resistant substrate and adhered to the stainless steel plate. For example, in the step of diffusing impurities into the semiconductor thin film to form a junction layer, a variety of diffusion profiles are achieved because restrictions on the diffusion profile due to the processing temperature are relaxed.

According to an eighth aspect of the present invention, in a method of producing a thin-film solar cell, a graphite sheet is adhered to the heat resistant substrate by an adhesive including carbon as a base. Therefore, in a case where a rear electrode is formed on the semiconductor thin film after breaking the graphite sheet without removing fragments of the broken graphite sheet remaining on the surface of the semiconductor thin film, fragments of the adhesive do not block photocurrent.

According to a ninth aspect of the present invention, in a method of producing a thin-film solar cell, a graphite sheet is adhered to the heat resistant substrate by an adhesive including a ceramic as the base. The adhesive including ceramics is effective when a processing temperature of the semiconductor thin film on the heat resistant substrate is high.

BRIEF DESCRIPTION OF THE DRAWINGS

FIGS. 5(a)-5(k) are cross-sectional views illustrating process steps in a method of producing a thin-film solar cell in accordance with a first embodiment of the present invention;

FIGS. 6(a)-6(j) are cross-sectional views illustrating process steps in a method of producing a thin-film solar cell in accordance with a second embodiment of the present invention;

FIGS. 7(a)-7(k) are cross-sectional views illustrating process steps in a method of producing a thin-film solar cell in accordance with a third embodiment of the present invention;

FIGS. 8(a)-8(j) are cross-sectional views illustrating process steps in a method of producing a thin-film solar cell in accordance with a fourth embodiment of the present invention;

BRIEF DESCRIPTION OF THE PREFERRED EMBODIMENTS

Figure 1A:
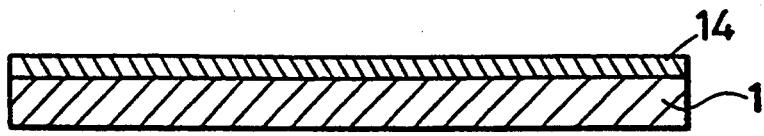
FIGS. 1(a)–1(d) are cross-sectional views for explaining a basic concept of a method of producing a thin-film solar cell in accordance with the present invention.

FIGS. 1(a)-1(d) are cross-sectional views for explaining a basic concept of a method of producing a thin-film solar cell in accordance with the present invention. In the figures, the same reference numerals as in FIGS. 10(a)-10(d) designate the same or corresponding parts. In the present invention, a graphite sheet 14 comprising flaky graphite is used as the layer which is broken when the semiconductor thin film 2 is separated from the heat resistant substrate 1. In the graphite sheet 14, the breaking stress in the direction of its thickness, i.e., a perpendicular direction is smaller than a breaking stress in a direction parallel to the thickness.

Figure 1B:
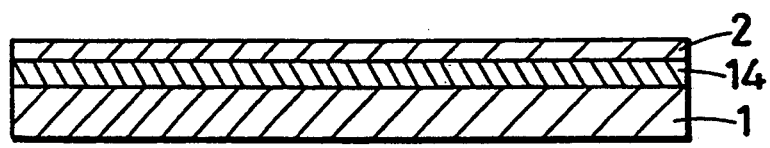
Figure 1C:
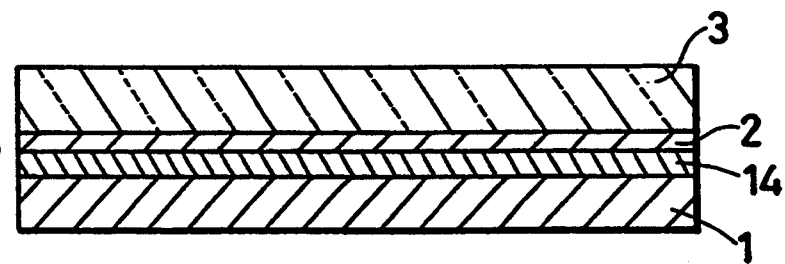
Figure 1D:
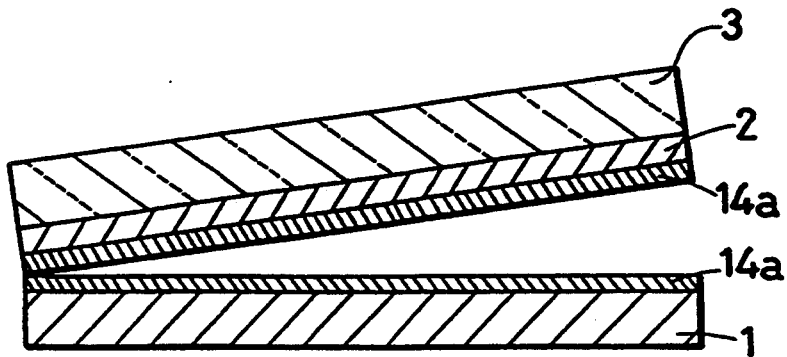

Initially, the graphite sheet 14 is adhered to the heat resistant substrate 1 as illustrated in FIG. 1(a). Then, a semiconductor thin film 2 is grown on the graphite sheet 14 by thermal CVD or the like as illustrated in FIG. 1(b). Thereafter, the semiconductor thin film 2 is subjected to process steps, such as annealing, recrystallization, formation of a p-n junction, or the like, and then it is adhered to a glass substrate 3 as shown in FIG. 1(c). Then, a mechanical stress is applied to the heat resistant substrate 1 and the glass substrate 3 so that the breaking stress in the thickness direction of the graphite sheet 14 may act on the graphite sheet 14 to break only the graphite sheet 14, whereby the semiconductor thin film 2 is separated from the heat resistant substrate 1. Fragments 14a of the graphite sheet 14 remaining on the surface of the semiconductor thin film 2 are removed as needed. The subsequent processing is carried out in the state where the semiconductor thin film 2 is disposed on the glass substrate 3.

Figure 2A:
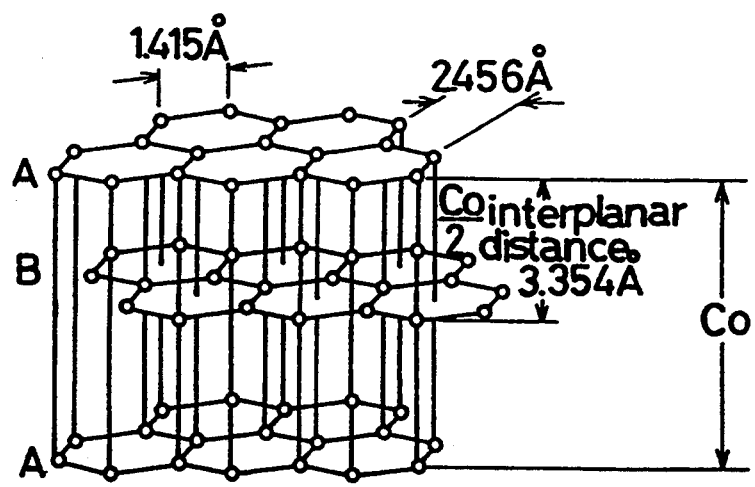
FIGS. 2(a) and 2(b) are diagrams illustrating a crystal structure of flaky graphite used in the method illustrated in FIGS. 1(a)–1(d)

A description is given of the graphite sheet 14. The graphite sheet 14 is made of flaky graphite occurring in nature and has a crystal structure shown in FIG. 2(a). In FIG. 2(a), six carbon atoms on the same plane form a carbon ring. The arrangement of the carbon rings on the plane A is slightly shifted from the arrangement of the carbon rings on the adjacent plane B. Therefore, although the bonds of the carbon atoms on the same plane are strong, the bonds of the carbon atoms between the upper plane A and the lower plane B are weak because the bonds depend on van der Waals force, so that the planes A and B are easily separated from each other. This crystal structure is similar to that of the conventional graphite powder when it is seen microscopically, but flaky graphite comprises lumps having crystal grains larger than in conventional graphite powder. The flaky graphite sometimes includes a lump with crystal grains as large as several millimeters.

A description is given of a method of making the graphite sheet.

Figure 3:
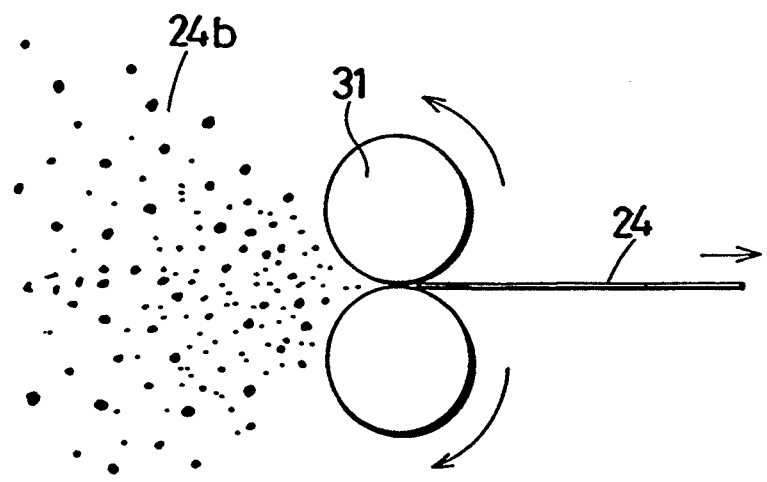
FIG. 3 is a schematic diagram illustrating a method of making the graphite sheet.

Initially, the flaky graphite is subjected to acid treatment using a solution comprising $NH_4OH$ and $H_2SO_4$ and then it is heated to approximately 300 C. to evaporate the acid, whereby the graphite foams, increasing its volume and resembling cotton. Then, as illustrated in FIG. 3, the foaming graphite 24b is continuously pressed by rollers 31, resulting in a graphite sheet 24. The thickness of the graphite sheet 24 is appropriately selected within a range of several tens of microns to several millimeters.

Figure 2B:
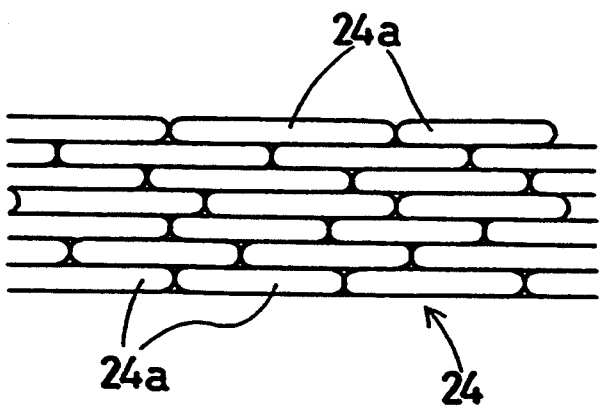
Figure 4:
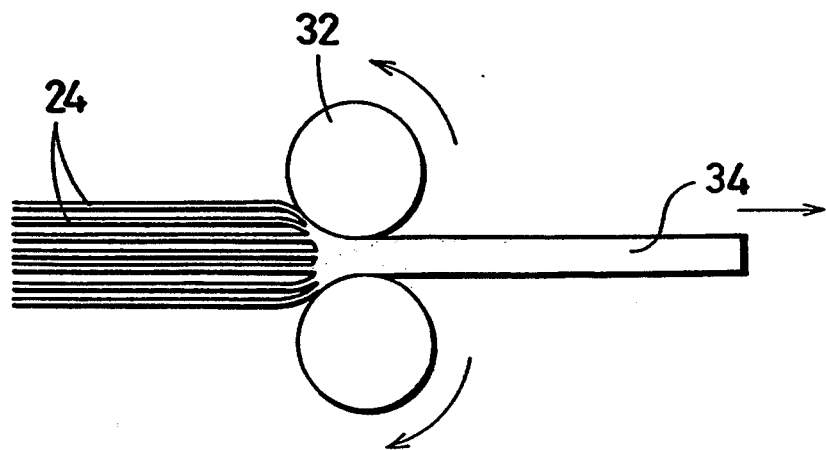
FIG. 4 is a schematic diagram illustrating another method of making the graphite sheet.
Figure 9:
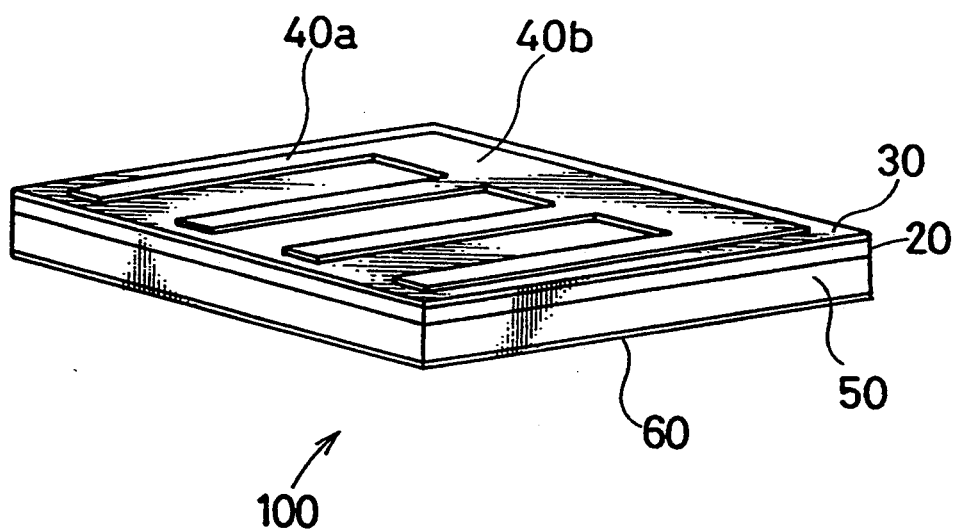
FIG. 9 is a perspective view illustrating a thin-film solar cell in accordance with the prior art.
Figure 10A:
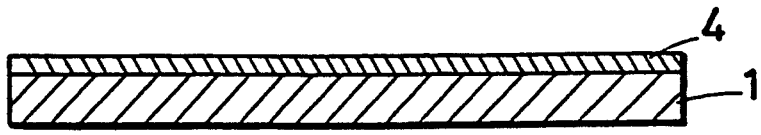
FIGS. 10(a)-10(d) are cross-sectional views for explaining a basic concept of a method of producing a thin-film solar cell in accordance with the prior art.
Figure 10B:
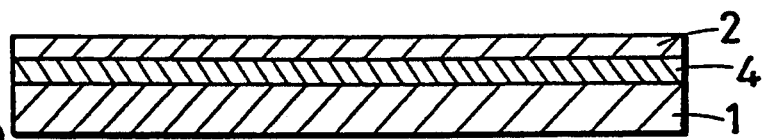
Figure 10C:
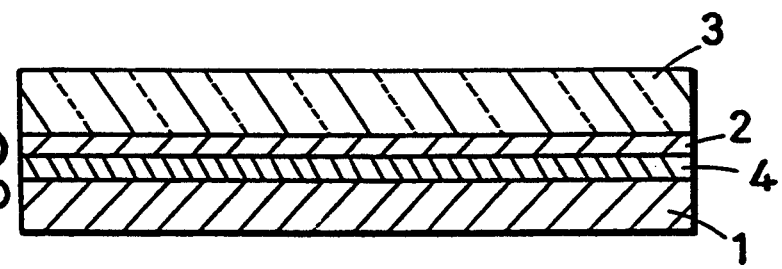
Figure 10D:
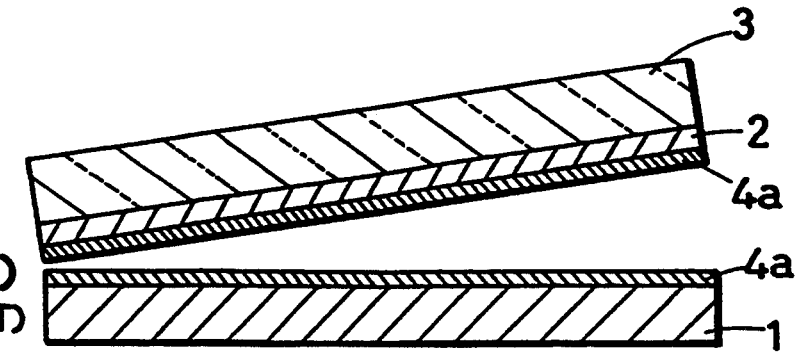
Figures 11A, 11B, 11C, 11D, 11E, 11F, 11G, 11H, 11I, 11J, 11K:
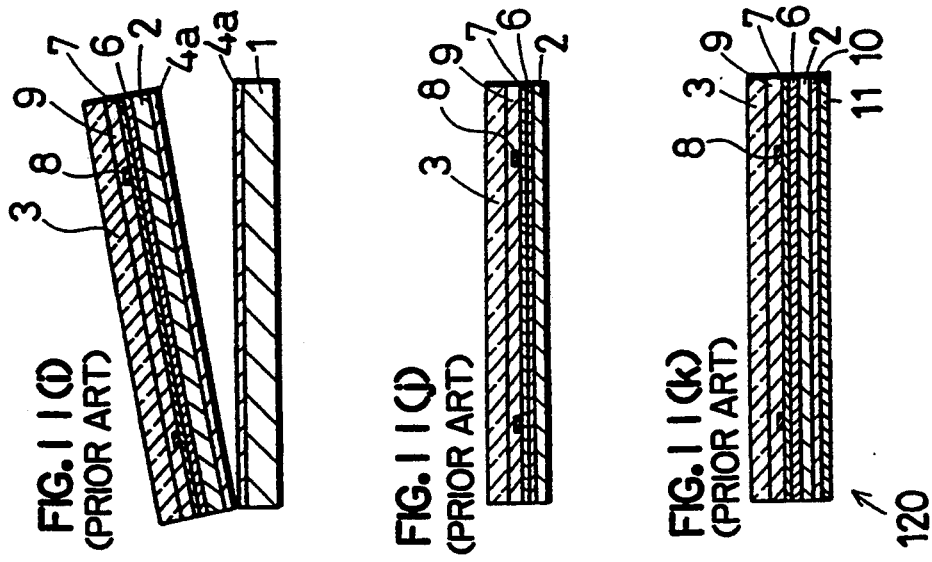
FIGS. 11(a)-11(k) are cross-sectional views illustrating process steps in a method of producing a thin-film solar cell in accordance with the prior art.

The graphite sheet 24 thus formed is very flexible, like paper, so that it is easily torn. Because of the crystal structure of the flaky graphite which is a material of the graphite sheet and the production method thereof by the application of pressure, in the graphite sheet, a crystal grain 24a is flat in a direction parallel to the surface of the sheet and a plurality of crystal grains 24a are laminated as shown in FIG. 2(b). That is, the crystal grains 24a easily exfoliate in response to breaking stress in the thickness direction of the graphite sheet and, therefore, the graphite sheet is very suitable for use as the layer to be broken. In addition, since the graphite sheet comprises graphite, i.e., carbon, it has a high heat-resisting property. In addition, the graphite sheet can be purified by the same process as that for purifying conventional carbon products. As shown in FIG. 4, a plurality of the graphite sheets 24 may be pressed by rollers 32 to form a laminated graphite sheet 34, whereby the thickness of the graphite sheet increases and the number of layers of the laminate increases.

Thus formed graphite sheets 24 and 34 have superior characteristics when used as the layer which is broken to separate the semiconductor thin film from the heat resistant substrate. Therefore, when the graphite sheet is used, a high-quality semiconductor thin film is formed and the semiconductor thin film is easily removed from the heat resistant substrate and adhered to the glass substrate 3. As the result, a high-performance thin film solar cell is produced at low cost.

A method of producing a thin-film solar cell in accordance with a first embodiment of the present invention will be described in detail with respect to actual process steps shown in FIGS. 5(a)-5(k). In FIGS. 5(a)-5(k), the same reference numerals as in FIGS. 11(a)-11(k) designate the same or corresponding parts.

Initially, a heat resistant substrate 1 comprising monocrystalline silicon is prepared (FIG. 5(a)). Then, a graphite sheet 14 about 100 microns thick is adhered to the substrate 1 with an adhesive 15 (FIG. 5(b)). The graphite sheet 14 is obtained by cutting the above-described graphite sheet 24 to a size appropriate for the formation of the thin-film solar cell. The adhesive 15 includes carbon as a base, so that it is refractory.

Then, a p type polycrystalline silicon film 2a is grown to a thickness of about 30 microns on the graphite sheet 14 by vapor phase deposition or the like (FIG. 5(c)). Then, a $SiO_2$ cap layer 5 is formed (FIG. 5(d)), and the p type polycrystalline Si thin film is subjected to zone melting recrystallization (FIG. 5(e)). After removing the cap layer 5 (FIG. 5(f)), a junction layer 6, an anti-reflection film 7, and a Ti/Ag grid electrode 8 are successively formed, completing the process steps with respect to the upper side of the thin-film solar cell (FIG. 5(g)).

Figure 12A:
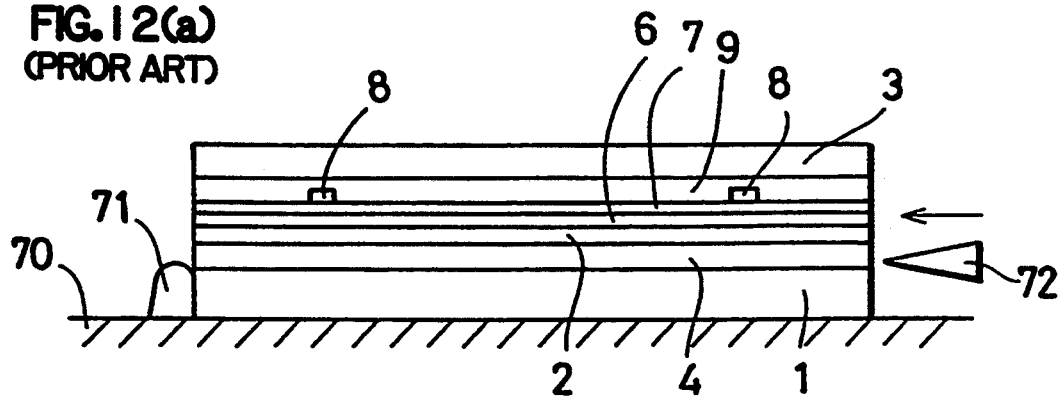
FIGS. 12(a) and 12(b) are schematic diagrams illustrating the step of FIG. 11(i) in more detail.
Figure 12B:
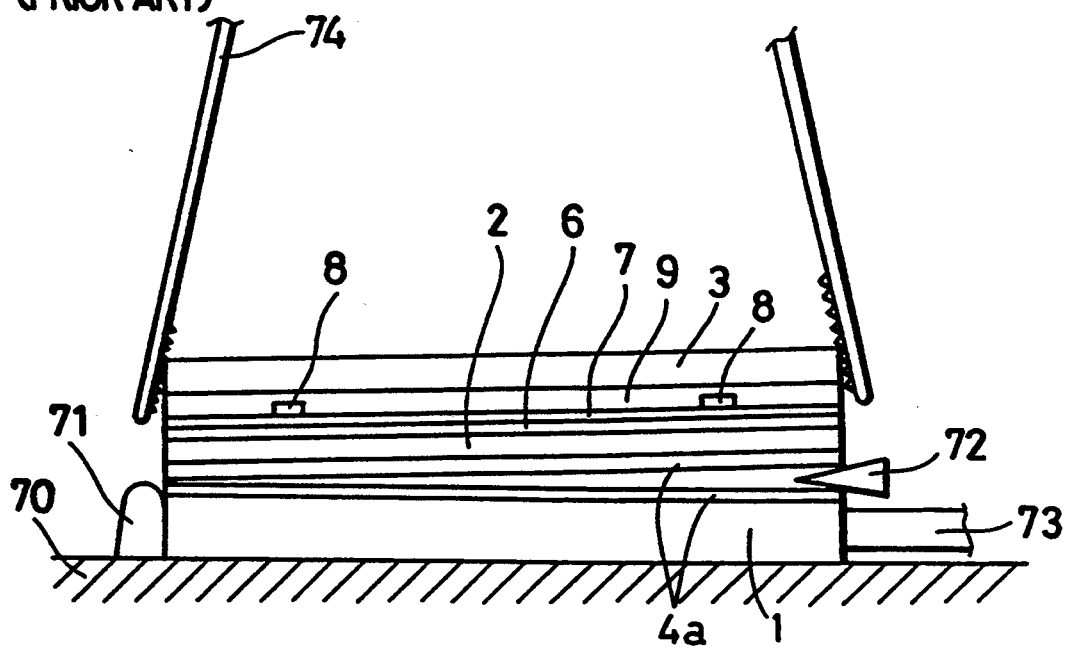

Then, a glass substrate 3 is adhered to the surface of the semiconductor thin film 2 with EVA resin 9 (FIG. 5(h)). The glass substrate 3 is usually used as a cover glass when a solar cell module is produced. Thereafter, a mechanical stress is applied to the heat resistant substrate 1 and the cover glass 3 so that the breaking stress in the thickness direction of the graphite sheet may act on the graphite sheet, whereby the graphite sheet 14 is broken to separate the semiconductor thin film 2 from the heat resistant substrate 1 (FIG. 5(i)). This separation is conducted in the same manner as described with respect to FIGS. 12(a) and 12(b). Thereafter, fragments 14a of the graphite sheet 14 remaining on the surface of the semiconductor thin film 2 are removed (FIG. 5(j)). Since the graphite sheet is very soft and fragile, the fragments 14a are removed by a brush or the like in such a manner that scales are removed from a fish.

Then, a p+ type BSF layer 10 and a rear electrode 11 comprising Al or Ag are successively formed on the rear surface of the semiconductor thin film 2, completing the process steps with respect to the rear side of the solar cell (FIG. 5(k)). In this way, the thin-film solar cell 101 is achieved. In addition, the heat resistant substrate 1 separated from the semiconductor thin film 2 is used repeatedly in the above-described production method of the thin-film solar cell.

According to the first embodiment of the present invention, the graphite sheet 14, in which a breaking stress in a direction of the thickness of the graphite sheet is smaller than a breaking stress in a direction perpendicular to the thickness direction, is adhered to the surface of the heat resistant substrate 1, the semiconductor thin film 2 is grown thereon by a high temperature processing, the glass substrate 3 is adhered to the surface of the semiconductor thin film, and a breaking stress in the thickness direction of the graphite sheet is applied to the graphite sheet to separate the semiconductor thin film 2 and the heat resistant substrate 1 from each other. Therefore, in the step of forming the semiconductor thin film 2 at a high temperature, the semiconductor thin film 2 is stably fixed onto the heat resistant substrate 1, and in the step of separating the semiconductor thin film 2 from the heat resistant substrate 1, they are easily separated by breaking the graphite sheet.

In addition, since the graphite sheet as the layer to be broken has an anisotropic breaking stress as described above, the fragments 14a of the graphite sheet 14 remaining on the surface of the semiconductor thin film 2 are easily removed by a brush or the like. In this case, there is no necessity of providing a special apparatus for the removal of the fragments 14a and, therefore, the method of this first embodiment has an advantage with respect to the equipment used in the production process and management thereof.

Accordingly, the semiconductor thin film 2 is favorably formed on the heat resistant substrate 1 and the separation between the semiconductor thin film 2 and the heat resistant substrate 1 is simplified, with a result that a high-quality thin film solar cell is produced at low cost with high reliability.

While in the above-described first embodiment the fragments 14a of the graphite sheet 14 are removed by a brush or the like, the fragments 14a may be removed by chemical etching. More specifically, since the graphite sheet is made from carbon, when it is subjected to thermal or plasma treatment in an ambient atmosphere including oxygen, oxygen reacts with carbon, whereby the fragments 14a remaining on the surface of the semiconductor thin film are completely removed.

While in the above-described first embodiment the heat resistant adhesive 15 includes carbon as a base, an adhesive including a ceramic as a base may be employed. The adhesive including a ceramic is effective when the processing temperature of the semiconductor thin film 2 on the heat resistant substrate 1 is high.

A description is now given of a method of producing a thin-film solar cell in accordance with a second embodiment of the present invention.

FIGS. 6(a)–6(j) are cross-sectional views illustrating process steps in a method of producing a thin-film solar cell in accordance with the second embodiment of the present invention. This second embodiment is different from the first embodiment only in that the fragments of the graphite sheet remaining on the semiconductor thin film are not removed but used as a part of a rear electrode because the graphite sheet including carbon as a base is electrically conductive.

Steps illustrated in FIGS. 6(a)–6(i) are identical to those already described with respect to FIGS. 5(a)–5(i) and, therefore, do not require repeated description.

After the semiconductor thin film 2 is separated from the heat resistant substrate 1 by breaking the graphite sheet 14, a rear electrode 11 comprising Al or Ag is formed on the fragments 14a of the graphite sheet 14 remaining on the surface of the semiconductor thin film 2 (FIG. 6(j)), resulting in a thin-film solar cell 102.

In this second embodiment, since the step of removing the fragments 14a of the graphite sheet 14 is omitted, producibility of the thin-film solar cell 102 is further improved in addition to the effects of the first embodiment.

In the first and second embodiments of the present invention, thin-film solar cells are produced in which the surface of the semiconductor thin film 2 on the heat resistant substrate 1 is absent serves as a light receiving surface. However, the method of producing a thin film solar cell according to the present invention may be applied to the case where the surface of the semiconductor thin film 2 on which the heat resistant substrate 1 is present is the light receiving surface.

More specifically, in the method of producing a solar cell according to the present invention, a basic concept resides in that the semiconductor thin film 2 contributing to power generation is removed from the heat resistant substrate 1 and adhered to the glass substrate 3. In other words, both surfaces of the semiconductor thin film 2 are once exposed during the production process, so that the degree of freedom in processing on the both surfaces is increased. Therefore, utilizing this advantage, it is possible to produce a thin-film solar cell in which the surface of the semiconductor thin film where the heat resistant substrate is present serves as a light receiving surface.

A method of producing such a solar cell will now be described. FIGS. 7(a)-7(k) are cross-sectional views illustrating process steps in a method of producing a thin-film solar cell according to a third embodiment of the present invention. Steps illustrated in FIGS. 7(a)-7(f) are identical to those already described with respect to FIGS. 5(a)-5(f) and, therefore, do not require repeated description.

After the cap layer 5 is removed, a p type BSF layer 10 and a rear electrode 11 comprising Al or Ag are successively formed on the surface of the semiconductor thin film 2, completing the process steps with respect to the rear side of the thin-film solar cell (FIG. 7(g)).

Then, a stainless plate 13 is adhered to the surface of the rear electrode 11 with, for example, Ag paste 16 (FIG. 7(h)). Then, a mechanical stress is applied to the heat resistant substrate 1 and the stainless plate 13 so that the breaking stress in the thickness direction of the graphite sheet 14 may act on the graphite sheet to break the graphite sheet, whereby the semiconductor thin film 2 is separated from the heat resistant substrate 1 (FIG. 7(i)). This separation is conducted in the same manner as described with respect to FIGS. 12(a) and 12(b). Then, remaining fragments 14a of the graphite sheet are removed by a brush or the like in the same manner that scales are removed from a fish (FIG. 7 (j)).

On the exposed surface of the semiconductor thin film 2, a junction layer 6 is formed by diffusing an n type dopant in a high concentration or by depositing an n type microcrystalline layer, whereby a p-n junction is produced in the semiconductor thin film 2. Thereafter, an ITO anti-reflection film 7 and a Ti/Ag grid electrode 8 are formed on the junction layer 6, completing the process steps with respect to the upper side of the thin-film solar cell (FIG. 7(k)). In this way, the thin-film solar cell 103 is produced.

According to the third embodiment of the present invention, since the stainless plate 13 is used as the substrate supporting the semiconductor thin film 2, thermal treatment is possible after the semiconductor thin film 2 is separated from the heat resistant substrate 1 and adhered to the stainless plate 13. For example, in the step of diffusing impurities into the the semiconductor thin film 2 to form the junction layer 6, a variety of diffusion profiles may be achieved because restrictions on the diffusion profile due to the processing temperature are relaxed.

In the above-described first to third embodiments of the present invention, it is supposed that the graphite sheet 14 cannot support itself because it is as thin as paper and, therefore, the heat resistant substrate 1 is used to support the semiconductor thin film 2. However, if the thickness of the graphite sheet is increased so that it has a mechanical strength sufficient to support itself and layers disposed thereon, the graphite sheet also serves as the heat resistant substrate.

A description is now given of a fourth embodiment of the present invention in which the graphite sheet serves both as the layer to be broken and the heat resistant substrate.

FIGS. 8(a)-8(j) are cross-sectional views illustrating process steps in a method of producing a thin-film solar cell in accordance with the fourth embodiment of the present invention. In this fourth embodiment, a thick graphite sheet 44 having a high mechanical strength capable of supporting itself during the high temperature processing for growing the semiconductor thin film is employed in place of the heat resistant substrate 1 and the graphite sheet 14 of the first embodiment.

Initially, on the graphite sheet 44 about several hundreds of microns thick (FIG. 8(a)), a p type polycrystalline silicon thin film 2a about 30 microns thick is formed by vapor phase deposition or the like (FIG. 8(b)). Steps illustrated in FIGS. 8(c)-8(f) are identical to those already described with respect to FIGS. 5(b)-5(g) and, therefore, do not require repeated description.

After the glass substrate 3 is adhered to the surface of the semiconductor thin film 2 with the EVA resin 9, a breaking stress in the thickness direction of the graphite sheet is applied to a portion of the graphite sheet 44 in the vicinity of the boundary between the graphite sheet 44 and the semiconductor thin film 2, whereby a greater part of the graphite sheet is removed. Then, fragments 44a of the graphite sheet 44 remaining on the surface of the semiconductor thin film are removed by a brush or the like (FIG. 8(i)).

Thereafter, a p+ type BSF layer 10 and a rear electrode 11 comprising Al or Ag are successively formed on the surface of the semiconductor thin film 2, completing the process steps with respect to the rear side of the thin-film solar cell (FIG. 8(j)).

According to the fourth embodiment of the present invention, the graphite sheet 44 capable of supporting itself during high temperature processing is employed in place of the graphite sheet 14 of the first embodiment, and the semiconductor thin film is formed thereon. Therefore, the graphite sheet 44 serves both as the heat resistant substrate 1 and the layer 14 to be broken, so that the heat resistant substrate, which is a part used in the production process, is dispensed with, thereby reducing the burden of management of the parts and the cost of the parts.

While in the above-described first to third embodiments the thin graphite sheet 24 is used as the layer to be broken, the laminated graphite sheet 34 obtained by pressing a plurality of the graphite sheets 24 as shown in FIG. 4 may be used. In this case, the laminated graphite sheet 34 is easily cleaved along the boundary between the graphite sheets 24, whereby the separation between the heat resistant substrate 1 and the semiconductor thin film 2 is performed smoothly.

As is evident from the foregoing description, according to the method of producing a thin-film solar cell of the present invention, a layer in which the breaking stress in a direction of the thickness of the layer is smaller than the breaking stress in a direction perpendicular to the thickness direction is formed on a heat resistant substrate, a semiconductor thin film is formed on the layer having the anisotropic breaking stress by high temperature processing, a second substrate for supporting the semiconductor thin film is adhered to the surface of the semiconductor thin film, and the layer having the anisotropic breaking stress is broken by applying a mechanical stress to the heat resistant substrate and the second substrate so that the breaking stress in the thickness direction may act on the layer, whereby the semiconductor thin film is separated from the heat resistant substrate. Therefore, in the high temperature processing for producing the semiconductor thin film, the semiconductor thin film is reliably supported by the heat resistant substrate, and in the step of separating the semiconductor thin film from the heat resistant substrate, the separation is easily carried out by breaking the layer.

In addition, since the layer to be broken has an anisotropic breaking stress, fragments of the broken layer remaining on the surface of the semiconductor thin film are easily removed.

Therefore, yield of the production process of the semiconductor thin film and work efficiency of the process of breaking the layer disposed between the semiconductor thin film and the heat resistant substrate, which yield and work efficiency have conventionally been trade-offs, are both improved, with a result that a high-quality thin film solar cell is produced with high reliability at low cost.

In addition, according to the present invention, after the semiconductor thin film is separated from the heat resistant substrate, fragments of the broken layer remaining on the surface of the semiconductor thin film are removed by brushing. Therefore, there is no necessity of providing a special apparatus for the removal of the fragments, so that this method has an advantage with respect to equipment used in the production and in the management thereof. Alternatively, the fragments of the broken layer may be removed by chemical etching. In this case, the fragments are completely removed.

In addition, according to the present invention, a conductive sheet comprising flaky graphite is used as the layer to be broken. Therefore, there is no necessity of removing fragments of the graphite sheet remaining on the surface of the semiconductor thin film, whereby work efficiency in the production process is further improved.

In addition, according to the present invention, the thickness of the graphite sheet is increased so that it may have a mechanical strength sufficient to support itself and the semiconductor thin film during the high temperature processing, whereby the graphite sheet also serves as the heat resistant substrate. Therefore, the heat resistant substrate, which is a part used in the production process, can be dispensed with, whereby the burden in management of the parts and cost of the parts are reduced.

In addition, according to the present invention, a transparent plate is used as the second substrate for supporting the semiconductor thin film, and the surface of the semiconductor thin film where the second substrate is present receives incident light. Therefore, the light receiving surface is not damaged by brushing or etching for removing fragments of the broken layer, so that absorption of incident light and generation of photocarriers are effectively carried out, resulting in a high-quality thin film solar cell.

In addition, according to the present invention, a stainless steel plate is used as the second substrate for supporting the semiconductor thin film. Therefore, thermal treatment is possible after the semiconductor thin film is separated from the heat resistant substrate and adhered to the stainless steel plate. For example, in the step of diffusing impurities into the the semiconductor thin film to form a junction layer, a variety of diffusion profiles are achieved because restrictions on the diffusion profile due to the processing temperature are relaxed.

In addition, according to the present invention, the graphite sheet is adhered to the heat resistant substrate by an adhesive including carbon as a base. Therefore, in a case where a rear electrode is formed on the semiconductor thin film after breaking the graphite sheet without removing fragments of the broken graphite sheet remaining on the surface of the semiconductor thin film, fragments of the adhesive do not block photocurrent.

In addition, according to the present invention, the graphite sheet is adhered to the heat resistant substrate by an adhesive including a ceramic as a base. The adhesive including a ceramic is effective when the processing temperature of the semiconductor thin film on the heat resistant substrate is high.

What is claimed is:

1. Amended) A method of producing a thin-film solar cell including a semiconductor thin film that converts incident light into electricity, comprising:
    forming, on a heat resistant substrate, a flaky graphite layer having a thickness and a breaking stress in a thickness direction that is smaller than the breaking stress in a direction perpendicular to the thickness direction;
    forming a semiconductor thin film on said flaky graphite layer by means of a high temperature process;
    adhering a second substrate for supporting said semiconductor thin film to the side of said semiconductor thin film facing away from said flaky graphite layer;
    breaking said flaky graphite layer by applying a mechanical stress to said heat resistant substrate and said second substrate so that a stress acts along the thickness direction, whereby said semiconductor thin film is separated from said heat resistant substrate; and
    producing a rear electrode on said semiconductor thin film without removing fragments of said flaky graphite layer remaining on said semiconductor thin film, said fragments being used as part of said rear electrode.

2. A method of producing a thin-film solar cell including a semiconductor thin film that converts incident light into electricity, comprising:
    forming, on a heat resistant substrate, a flaky graphite layer having a thickness and a breaking stress in a thickness direction that is smaller than the breaking stress in a direction perpendicular to the thickness direction;
    forming a semiconductor thin film on said flaky graphite layer by means of a high temperature process;
    adhering a stainless steel substrate for supporting said semiconductor thin film to a surface of said semiconductor thin film facing away from a light receiving surface of said semiconductor thin film; and
    breaking said flaky graphite layer by applying a mechanical stress to said heat resistant substrate and said stainless steel substrate so that a stress acts along the thickness direction, whereby said semiconductor thin film adhered to said stainless steel substrate is separated from said heat resistant substrate.

* * * * *

UNITED STATES PATENT AND TRADEMARK OFFICE
CERTIFICATE OF CORRECTION

PATENT NO. :   5,397,713
DATED      :   March 14, 1995
INVENTOR(S) :  Hamamota et al.

It is certified that error appears in the above-indentified patent and that said Letters Patent is hereby corrected as shown below:

Column 14, Line 16, delete "Amended)".

Signed and Sealed this

Thirteenth Day of June, 1995

Attest:

BRUCE LEHMAN

*Attesting Officer*      *Commissioner of Patents and Trademarks*